United States Patent
Ogiwara et al.

(10) Patent No.: US 7,834,682 B2
(45) Date of Patent: Nov. 16, 2010

(54) REFERENCE VOLTAGE GENERATION CIRCUIT AND SEMICONDUCTOR STORAGE APPARATUS USING THE SAME

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 12/187,011

(22) Filed: Aug. 6, 2008

(65) Prior Publication Data

US 2009/0039944 A1 Feb. 12, 2009

(30) Foreign Application Priority Data

Aug. 10, 2007 (JP) .............................. P2007-209841

(51) Int. Cl.
*G05F 1/10* (2006.01)
*G05F 3/02* (2006.01)
(52) U.S. Cl. ....................................................... 327/539
(58) Field of Classification Search ................... 327/540
See application file for complete search history.

(56) References Cited

U.S. PATENT DOCUMENTS 7,092,304 B2 8/2006 Ogiwara et al.
7,301,321 B1 * 11/2007 Uang et al. .................. 323/313
2006/0197585 A1 * 9/2006 Kim et al. .................... 327/539
2007/0121404 A1 * 5/2007 Ogiwara et al. ............. 365/210

FOREIGN PATENT DOCUMENTS

JP 8-272465 10/1996
JP 2004-158087 6/2004

* cited by examiner

*Primary Examiner*—Lincoln Donovan
*Assistant Examiner*—Daniel Rojas
(74) *Attorney, Agent, or Firm*—Oblon, Spivak, McClelland, Maier & Neustadt, L.L.P.

(57) ABSTRACT

According to an aspect of the present invention, there is provided a reference voltage generation circuit including: a first circuit configured to generate a first voltage that is independent of a power supply voltage and that is dependent of a temperature; a second circuit configured to generate a second voltage that is independent of the power supply voltage and that is dependent of the temperature; and a third circuit configured to compare the first voltage and the second voltage and to generate a reference voltage based on a higher one therebetween.

13 Claims, 6 Drawing Sheets

REFERENCE VOLTAGE GENERATION CIRCUIT AND SEMICONDUCTOR STORAGE APPARATUS USING THE SAME

CROSS-REFERENCE TO RELATED APPLICATIONS

The entire disclosure of Japanese Patent Application No. 2007-209841 filed on Aug. 10, 2007 including specification, claims, drawings and abstract is incorporated herein by reference in its entirety.

BACKGROUND OF THE INVENTION

1. Field of the Invention

An aspect of the present invention relates to a reference voltage generation circuit having a desired temperature dependency and to a semiconductor storage apparatus using the reference voltage generation circuit.

2. Description of the Related Art

Conventional semiconductor apparatuses, more particularly, conventional semiconductor storage apparatuses having ferroelectric memory cells or the like employ reference voltage generation circuits having desired temperature dependencies (see, e.g., JP-2004-158087-A). Such a reference voltage generation circuit has a band gap reference (BGR) circuit that generates a constant voltage which has a temperature dependency and does not depend on a power supply voltage in a given voltage range.

Meanwhile, burn-in (acceleration) test is performed on semiconductor storage apparatuses to apply a high power supply voltage as one of reliability tests. Thus, it is necessary for reference voltage generation circuits to generate a voltage which increases depending on a power supply voltage that is equal to or higher than a given value (i.e., a burn-in start voltage).

The following method is considered as one means for achieving such an object. That is, according to this method, an apparatus is configured to have a first circuit for generating a constant voltage, which does not depend on a power supply voltage, and a second circuit for generating a burn-in voltage which rises in proportion to the power supply voltage. And, this apparatus is adapted to combine outputs of the first circuit and the second circuit, to output the constant voltage in a range of voltages which are equal to or lower than a burn-in start voltage, and to output the burn-in voltage in a range of voltages which are higher than the burn-in start voltage.

However, when such a method is applied to a conventional reference voltage generation circuit having a temperature dependency, a sufficient burn-in (acceleration) test cannot be performed in a normal operation assurance temperature range, because the second circuit does not have an appropriate temperature dependency. That is, in a case where the burn-in start voltage (e.g., 3.8 [V]) is set at the lower limit (e.g., −40° C.) of the normal operation assurance temperature range, the constant voltage output from the first circuit rises depending on a temperature which is equal to or higher than the burn-in start voltage. Accordingly, as the temperature rises, the burn-in start voltage rises. Thus, at a high temperature (e.g., 85° C.), an appropriate burn-in voltage cannot be generated. In a range of voltages which are equal to or lower than the upper limit (e.g., 4.5 [V]) of the power supply voltage, a reference voltage remains the constant voltage. Consequently, the burn-in (acceleration) test cannot be performed.

SUMMARY OF THE INVENTION

According to an aspect of the present invention, there is provided a reference voltage generation circuit including: a first circuit configured to generate a first voltage that is independent of a power supply voltage and that is dependent of a temperature; a second circuit configured to generate a second voltage that is independent of the power supply voltage and that is dependent of the temperature; and a third circuit configured to compare the first voltage and the second voltage and to generate a reference voltage based on a higher one therebetween.

According to another aspect of the present invention, there is provided a semiconductor storage apparatus including: a plurality of memory cells; a judgment circuit that judges a data read out of the memory cells; and the reference voltage generation circuit, wherein the judgment circuit judges the data read out of the memory cells based on the reference voltage generated by the reference voltage generation circuit.

BRIEF DESCRIPTION OF THE DRAWINGS

Embodiments may be described in detail with reference to the accompanying drawings, in which.

DETAILED DESCRIPTION OF THE INVENTION

Hereinafter, embodiments of the present invention are described with reference to the accompanying drawings.

First Embodiment

Figure 1:
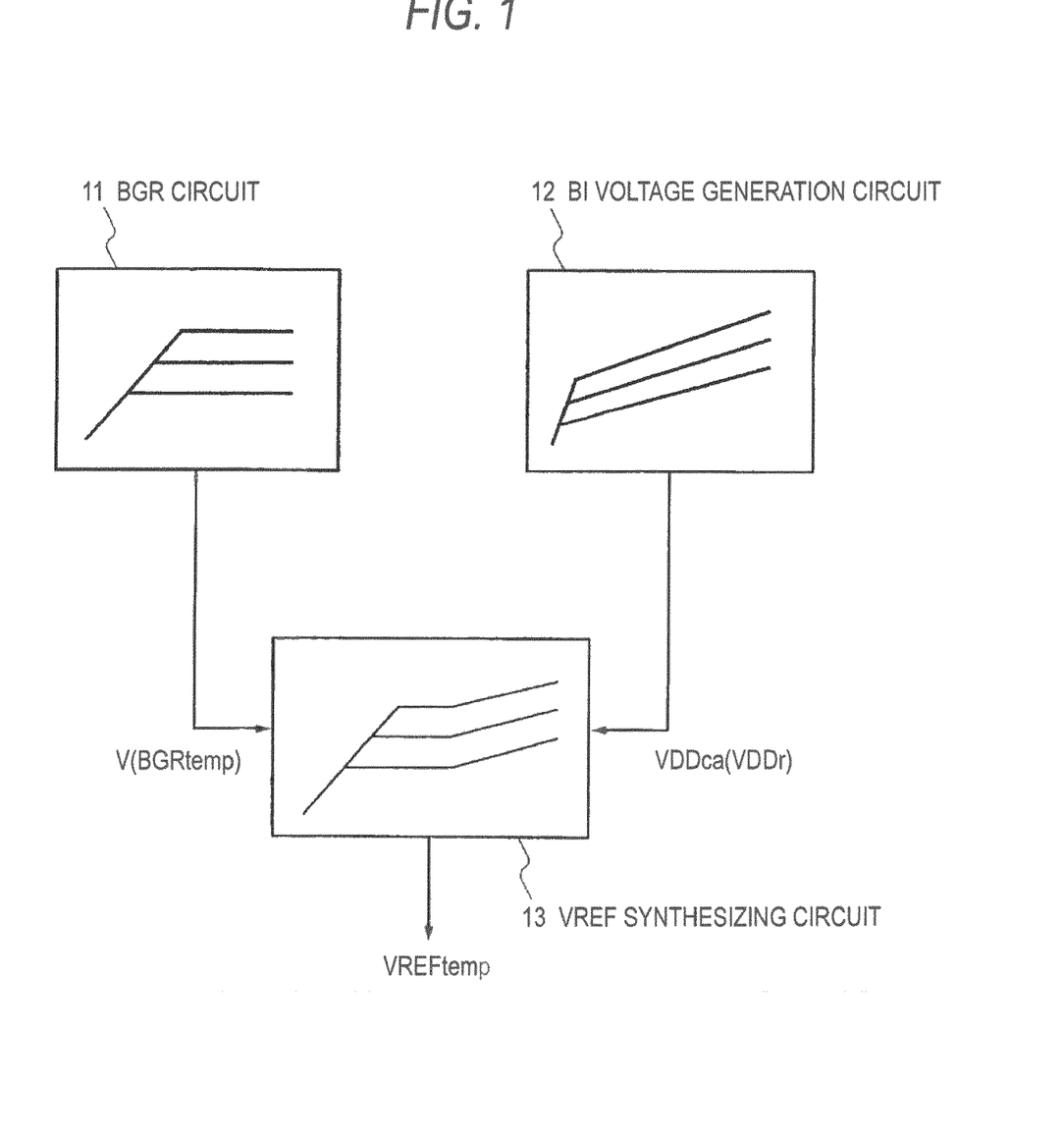
FIG. 1 is a circuit block diagram illustrating a reference voltage generation circuit according to a first embodiment.

FIG. 1 is a circuit block diagram illustrating a reference voltage generation circuit according to a first embodiment.

FIG. 1 illustrates a part used to generate a reference voltage (hereinafter referred to as "VREFtemp") having a temperature dependency. The reference voltage having a temperature dependency is used to, for example, determine a data value represented by a signal read from a memory cell. The demand for VREFtemp having a temperature dependency, in which a voltage rises as a temperature rises, is described in, e.g., JP-2004-158087-A.

The reference voltage generation circuit according to the first embodiment includes a BGR circuit 11 that generates a reference voltage (hereunder referred to as "V(BGRtemp)"), which has a desired temperature dependency and is a constant voltage that does not depend on a power supply voltage), a BI voltage generation circuit 12 that generates a referential voltage (hereunder referred to as "VDDca"), which has a similar temperature dependency at least at a specific power supply and which has a voltage value that changes in response to a change in the power supply voltage, and a VREF synthesizing circuit 13 that compares the voltage V(BGRtemp) with the voltage VDDca and that generates and outputs VREFtemp based on one of the voltages V(BGRtemp) and VDDca, which has a higher voltage level.

The voltage V(BGRtemp) output from the BGR circuit 11 is input to a first input terminal of the VREF synthesizing circuit 13. The voltage VDDca output from the BI voltage generation circuit 12 is input to a second input terminal of the VREF synthesizing circuit 13. The reference voltage VREFtemp output from the VREF synthesizing circuit 13 is used as a referential voltage for generating a drive voltage of a dummy capacitor (not shown).

Figure 2:
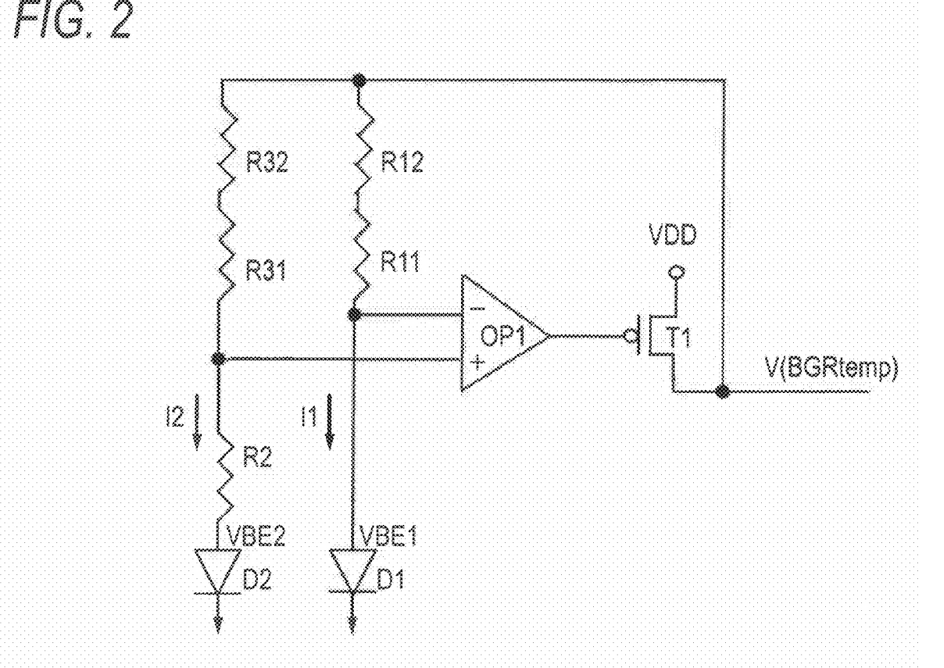
FIG. 2 is a circuit diagram illustrating a BGR circuit 11 in the reference voltage generation circuit according to the first embodiment.

FIG. 2 is a circuit diagram illustrating the BGR circuit 11 in the reference voltage generation circuit according to the first embodiment.

The BGR circuit 11 includes two diodes D1 and D2, three resistors R11, R2, and R31 for setting a constant voltage serving as a base portion of the referential voltage V(BGRtemp), two variable resistors R12 and R32 for setting a desired temperature characteristic, and p-type MOS transistor T1 and a differential amplifier OP1, which control the referential voltage V(BGRtemp).

The source of the p-type MOS transistor T1 is connected to a power supply VDD. An output of the differential amplifier OP1 is connected to the gate of the p-type MOS transistor T1. An output from the drain of the p-type MOS transistor T1 is supplied to a first input terminal of the VREF synthesizing circuit 13 as an output V(BGRtemp) of the BGR circuit 11.

The cathode of the diode D1 is connected to a ground GND. The anode of the diode D1 is connected to one terminal of the resistor R2. The other terminal of the resistor R2 is connected to a first input terminal of the differential amplifier OP1 and to one terminal of the resistor R31. The other terminal of the resistor R31 is connected to one terminal of the resistor R32. The other terminal of the resistor R32 is connected to the drain of the p-type MOS transistor T1.

The cathode of the diode D2 is connected to the ground GND. The anode of the diode D2 is connected to a second input terminal of the differential amplifier OP1 and to one terminal of the resistor R11. The other terminal of the resistor R11 is connected to one terminal of the resistor R12. The other terminal of the resistor R12 is connected to the drain of the p-type MOS transistor T1.

In the BGR circuit 11, a current I1 flowing in the diode D1 and a current I2 flowing in the diode D2 can be changed by changing the resistance values of the resistors R12 and R32. Therefore, a temperature dependency of the output V(BGRtemp) of the BGR circuit 11 is adjustable. In the embodiment, the variable resistors R12 and R32 are configured so as to be changed step by step according to a trimming address. Therefore, the temperature dependency of the output V(BGRtemp) of the BGR circuit 11 is adjustable step by step according to the trimming address.

The resistors R11, R2, and R31 are used to set a voltage serving as the base portion of the referential voltage V(BGRtemp). In a case where the resistance value of each of the resistors R12 and R32 is 0 [Ω], the resistors R11, R2, and R31 are set so that the referential voltage V(BGRtemp) does not have a temperature dependency, and that the voltage V(BGRtemp)=1.21 [V]. A practical method for setting the resistors R11, R2, and R31 is described in, e.g., paragraphs [0016] to [0020] of JP-2004-158087-A.

The variable resistors R12 and R32 have resistance values that are changeable according to the trimming address. A desired temperature dependency can be imparted to the referential voltage V(BGRtemp). A practical method for setting the resistors R12, and R32 is described in, e.g., paragraphs to [0023] of JP-2004-158087-A.

Figure 3:
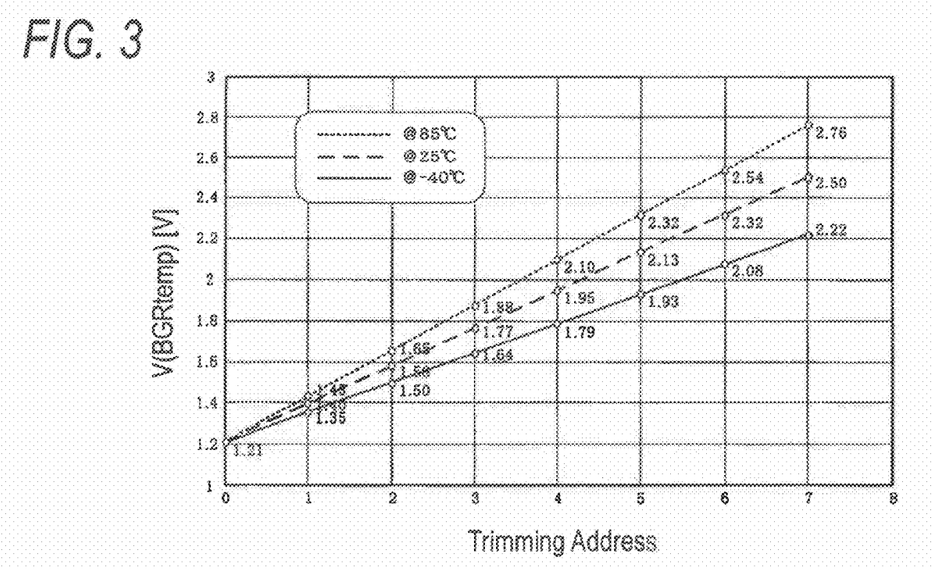
FIG. 3 is a graph illustrating a characteristic of the BGR circuit 11 according to the first embodiment.

FIG. 3 is a graph illustrating a characteristic of the BGR circuit 11 according to the first embodiment.

The ordinate axis of the graph illustrated in FIG. 3 represents the voltage V(BGRtemp). The abscissa axis of the graph illustrated in FIG. 3 represents the trimming address according to which the resistors R12 and R32 are set. In the graph, a solid line indicates a change of the voltage V(BGRtemp) with respect to the trimming address at a low temperature of −40° C. A dashed line indicates a change of the voltage V(BGRtemp) with respect to the trimming address at a normal temperature of 25° C. A dotted line indicates a change of the voltage V(BGRtemp) with respect to the trimming address at a high temperature of 85° C.

As is seen from FIG. 3, the referential voltage V(BGRtemp) generated by the BGR circuit 11 according to the first embodiment has a positive temperature dependency. That is, the referential voltage V(BGRtemp) is set to meet the following condition.

V(BGRtemp)@85° C.>V(BGRtemp)@25° C.>V(BGRtemp)@−40° C. where the expression "V(BGRtemp) @xx ° C." represents the voltage V(BGRtemp) at each temperature of "xx"° C.

In the first embodiment, there is shown an exemplary circuit configuration capable of performing a burn-in test in the temperature range of from −40° C. to 85° C. so that the reference voltage is proportional to the power supply voltage VDD from a voltage (burn-in start voltage) VDD=3.8 [V] in a case where the BGR circuit 11 is set at trimming address 3, and where V(BGRtemp)@−40° C.=1.64 [V], V(BGRtemp)@25° C.=1.77 [V], and V(BGRtemp)@85° C.=1.88 [V].

Figure 4:
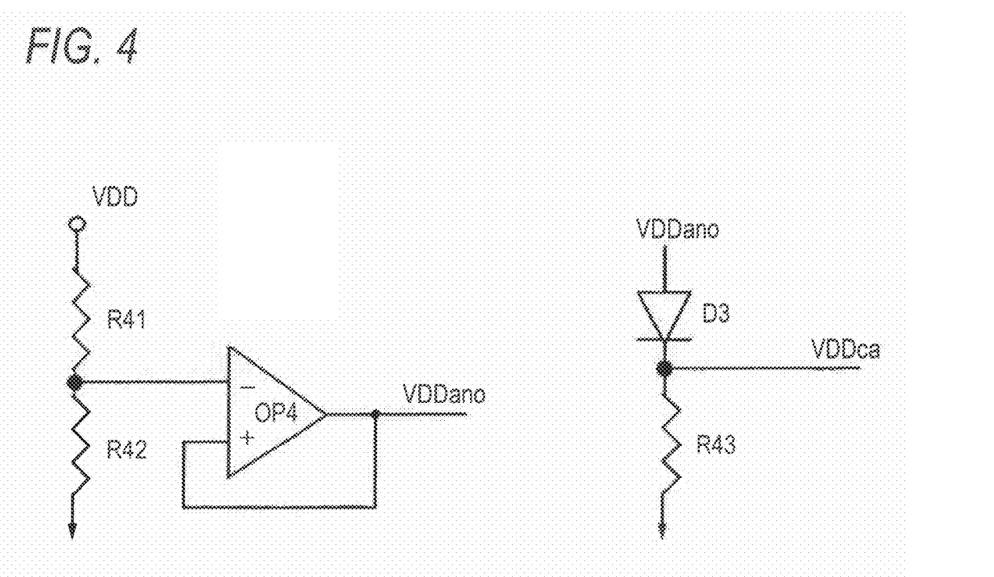
FIG. 4 is a circuit diagram illustrating a BI voltage generation circuit 12 in the reference voltage generation circuit according to the first embodiment.

FIG. 4 is a circuit diagram illustrating the BI voltage generation circuit 12 in the reference voltage generation circuit according to the first embodiment.

The BI voltage generation circuit 12 includes resistors R41 and R42 used to generate a divided voltage of the power supply voltage VDD, and includes also a differential amplifier OP4, a diode D3, and a resistor R43.

One terminal of the resistor R41 is connected to the power supply voltage VDD. The other terminal of the resistor R41 is connected to one terminal of the resistor R42. The other terminal of the resistor R42 is connected to the ground GND. A connection node between the resistors R41 and R42 is connected to a first input terminal of the differential amplifier OP4. An output of the differential amplifier OP4 is connected to a second input terminal thereof. The output of the differential amplifier OP4 is connected to the anode of the diode D3 as a voltage VDDano. The cathode of the diode D3 is connected one terminal of the resistor R43. The other terminal of the resistor R43 is connected to the ground GND. Further, an output from the cathode of the diode D3 is supplied as the output voltage VDDca of the BI voltage generation circuit 12 to a second input terminal of the VREF synthesizing circuit 13.

The resistors R41 and R42 are set so that the voltage $$VDDano = VDD \times (1.64 + dio@-40°C.)/3.8 \text{ [V]}.$$

The voltage VDDano has a value which does not depend on temperature in the temperature range of −40° C. to 85° C. and which is proportional to the power supply voltage VDD. The expression "dio@−40° C." represents a forward voltage drop of the diode D3 at a temperature of −40° C. The temperature dependency of the diode D3 is −0.002 [V/° C.] at a power supply voltage VDD of 3.8 [V] (VDD=3.8 [V]).

The voltage VDDano is constant over the temperature range from −40° C. to 85° C. In addition, the temperature dependency of the forward voltage drop of the diode D3 is −0.002 [V/° C.]. Thus, in a case where VDD=3.8 [V], the cathode voltage VDDca of the diode D3 has the following values at temperatures of −40° C., 25° C., and 85° C., respectively.

$$VDDca@-40°C. = 1.64 \text{ [V]}$$

$$VDDca@25°C. = 1.64 + 0.002 \times \{25-(-40)\} = 1.77 \text{ [V]}$$

$$VDDca@85°C. = 1.64 + 0.002 \times \{85-(-40)\} = 1.89 \text{ [V]}$$

where the expression "VDDca@xx ° C." represents the voltage VDDca at "xx" ° C.

The temperature dependency of the voltage VDDca where VDD=3.8 [V] are set to be substantially equal to those of the voltage V(BGRtemp) where the trimming address is set to 3 as illustrated in FIG. 3.

Figure 5:
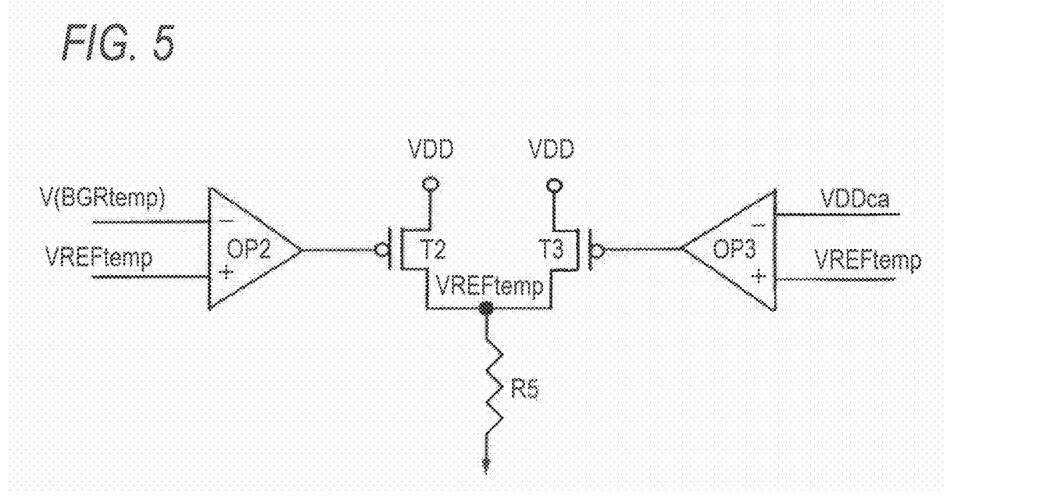
FIG. 5 is a circuit diagram illustrating a VREF synthesizing circuit 13 in the reference voltage generation circuit according to the first embodiment.

FIG. 5 is a circuit diagram illustrating the VREF synthesizing circuit 13 in the reference voltage generation circuit according to the first embodiment.

The VREF synthesizing circuit 13 includes a differential amplifier OP2 for comparing the voltage VREFtemp with the voltage V(BGRtemp), a differential amplifier OP3 for comparing the voltage VREFtemp with the voltage VDDca, two p-type MOS transistors T2 and T3 for controlling the voltage VREFtemp based on outputs of the difference amplifiers OP2 and OP3, and a resistor R5.

The voltage V(BGRtemp) is input to a first input terminal of the differential amplifier OP2. The voltage VREFtemp is input to a second input terminal of the differential amplifier OP2. The source of the p-type MOS transistor T2 is connected to the power supply voltage VDD. The gate of the p-type MOS transistor T2 is connected to an output of the differential amplifier OP2. The drain of the p-type MOS transistor T2 is connected to one terminal of the resistor R5. The other terminal of the resistor R5 is connected to the ground GND.

The voltage VDDca is input to a first input terminal of the differential amplifier OP3. The voltage VREFtemp is input to a second input terminal of the differential amplifier OP3. The source of the p-type MOS transistor T3 is connected to the power supply voltage VDD. The gate of the p-type MOS transistor T3 is connected to an output of the differential amplifier OP3. The drain of the p-type MOS transistor T3 is connected to the drain of the p-type MOS transistor T2. Further, an output from the connection node among the drain of the p-type MOS transistor T2, the drain of the p-type MOS transistor T3 and the resistor R5 is supplied to a sense amplifier portion (not shown) of a memory cell array as an output VREFtemp of the VREF synthesizing circuit 13.

The differential amplifier OP2 compares the voltage V(BGRtemp) with the voltage VREFtemp. In a case where V(BGRtemp)>VREFtemp, the differential amplifier OP2 operates to turn on the p-type MOS transistor T2 thereby increasing a current flowing to the resistor R5. In addition, the differential amplifier OP2 raises the voltage VREFtemp so that V(BGRtemp)=VREFtemp.

Similarly, the differential amplifier OP3 compares the voltage VDDca with the voltage VREFtemp. In a case where VDDca>VREFtemp, the differential amplifier OP3 operates to turn on the p-type MOS transistor T3 thereby increasing a current flowing to the resistor R5. In addition, the differential amplifier OP3 raises the voltage VREFtemp so that VDDca=VREFtemp.

The VREF synthesizing circuit 13 compares the voltage V(BGRtemp) with the voltage VDDca and generates and outputs the voltage VREFtemp based on one of the voltages V(BGRtemp) and VDDca, which is higher than the other.

Figure 6:
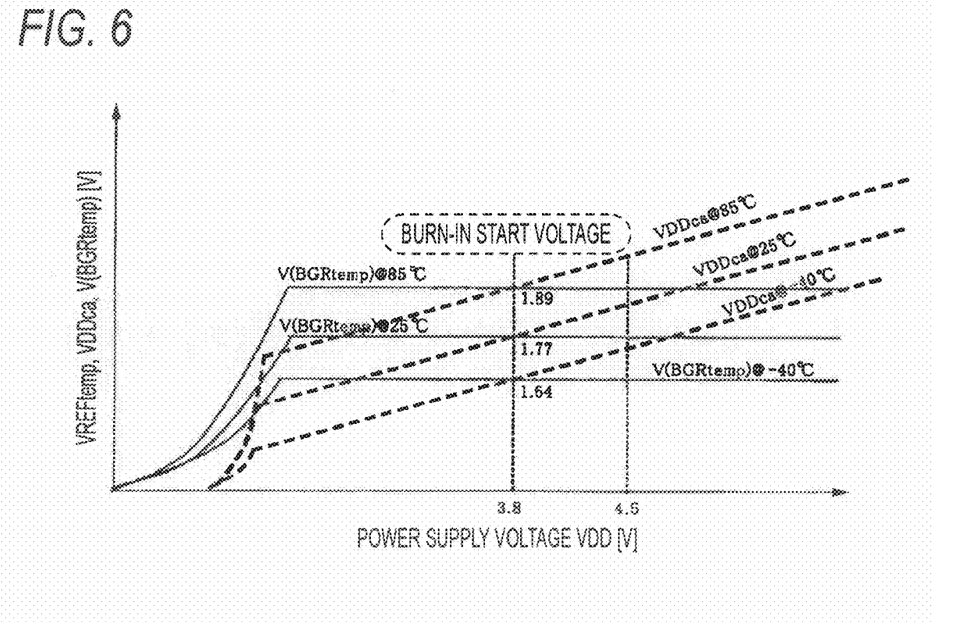
FIG. 6 is a graph illustrating an output (VREFtemp) of the VREF synthesizing circuit 13 according to the first embodiment.

FIG. 6 is a graph illustrating an output (VREFtemp) of the VREF synthesizing circuit 13.

The ordinate axis of the graph illustrated in FIG. 6 represents the voltage VREFtemp [V]. The abscissa axis of the graph illustrated in FIG. 6 represents the power supply voltage VDD [V]. In the graph, solid lines indicate the voltages V(BGRtemp) respectively corresponding to temperatures of −40° C., 25° C., and 85° C. Dashed lines indicate the voltages VDDca respectively corresponding to temperatures of −40° C., 25° C., and 85° C.

As described above, when the power supply voltage VDD is equal to the burn-in start voltage (VDD=3.8 [V]), the temperature dependency of the reference voltage V(BGRtemp) is substantially equal to that of the voltage VDDca. Therefore, the voltage VREFtemp maintains a constant value in a case where the power supply voltage VDD<3.8 [V] and rises according to each of the dashed lines representing VDDca in a case where VDD>3.8 [V], independently of the temperature in the temperature range from −40° C. to 85° C.

That is, a burn-in (acceleration) test can be performed by using of VREFtemp that is proportional to the power supply voltage VDD from the burn-in start voltage 3.8 [V] independently of temperature.

According to the first embodiment, at the burn-in start voltage (3.8 [V]), the temperature dependency of the reference voltage V(BGRtemp) is substantially equal to that of the voltage VDDca. Consequently, a sufficient burn-in test can be performed in the temperature range from −40° C. to 85° C.

Second Embodiment

Figure 7:
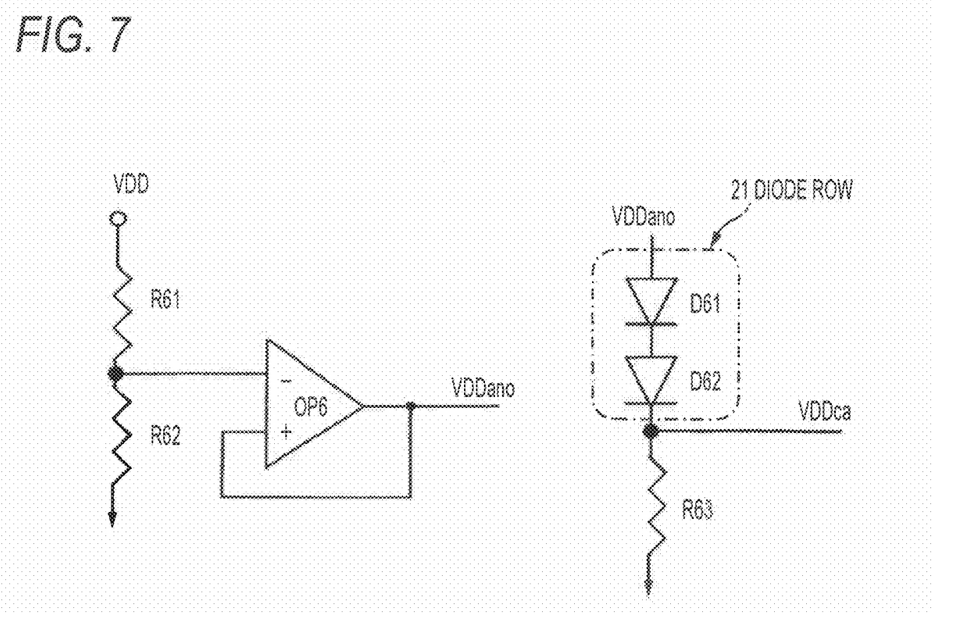
FIG. 7 is a circuit diagram illustrating a BI voltage generation circuit 12 in a reference voltage generation circuit according to a second embodiment.

FIG. 7 is a circuit diagram illustrating a BI voltage generation circuit 12 in a reference voltage generation circuit according to a second embodiment. The circuit configuration, the functions and the operation of each of a BGR circuit 11 and a VREF synthesizing circuit 13 according to the second embodiment are similar to those of the associated circuit according to the first embodiment. Thus, the detailed description of the BGR circuit 11 and the VREF synthesizing circuit 13 according to the second embodiment is omitted.

The difference between the second embodiment and the first embodiment is that the BGR circuit 11 is set at trimming address 7. In the second embodiment, there is shown an exemplary circuit configuration capable of performing a burn-in test in the temperature range of from −40° C. to 85° C. so that the reference voltage is proportional to the power supply voltage VDD in a range where the power supply voltage VDD is equal to or higher than a burn-in start voltage of 3.8 [V] in a case where V(BGRtemp)@−40° C.=2.22 [V], V(BGRtemp)@25° C.=2.50 [V], and V(BGRtemp)@85° C.=2.76 [V].

The BI voltage generation circuit 12 according to the second embodiment includes resistors R61 and R62 used to generate a divided voltage of the power supply voltage VDD, a differential amplifier OP6, a diode row in which two diodes D61 and D62 are series-connected in the same direction, and a resistor R63.

One terminal of the resistor R61 is connected to the power supply voltage VDD. The other terminal of the resistor R61 is connected to one terminal of the resistor R62. The other terminal of the resistor R62 is connected to the ground GND. The connection node between the resistors R61 and R62 is connected to a first input terminal of the differential amplifier OP6. An output of the differential amplifier OP6 is connected to a second input terminal thereof. The output of the differential amplifier OP6 is connected to the anode terminal of the diode row 21, i.e., the anode of the diode D61 as the voltage VDDano. The cathode of the diode D61 is connected to the anode of the diode D62. The cathode of the diode D62, which is the cathode terminal of the diode row 21, is connected to one terminal of the resistor R43. The other terminal of the resistor R43 is connected to the ground GND. An output from the cathode terminal of the diode row 21 is supplied as the output voltage VDDca of the BI voltage generation circuit 12 to a second input terminal of the VREF synthesizing circuit 13

The resistors R61 and R62 are set so that $$VDDano=VDD\times(2.22+2\times dio@-40°\ C.)/3.8\ [V].$$

The voltage VDDano has a value which does not depend on temperature in the temperature range from −40° C. to 85° C. and which is proportional to the power supply voltage VDD. The diodes D61 and D62 have the same characteristic (e.g., a size (the pn-junction area), and the same temperature dependency (−0.002 [V/° C.] at a power supply voltage VDD of 3.8 [V]). The expression "dio@−40° C." represents a forward voltage drop of the diodes D61 and D62 at a temperature of −40° C.

The voltage VDDano is constant over the temperature range from −40° C. to 85° C. In addition, the temperature dependency of the forward voltage drop of each of the diodes D61 and D62 is −0.002 [V/° C.]. Thus, in a case where VDD=3.8 [V], the cathode voltage VDDca of the diode D62 has the following values at temperatures of −40° C., 25° C., and 85° C., respectively.

$$VDDca@-40°\ C.=2.22\ [V]$$

$$VDDca@25°\ C.=2.22+2\times0.002\times\{25-(-40)\}=2.48\ [V]$$

$$VDDca@85°\ C.=2.22+2\times0.002\times\{85-(-40)\}=2.72\ [V]$$

The temperature dependency of the voltage VDDca where VDD=3.8 [V] are set to be substantially equal to those of the voltage V(BGRtemp) where the trimming address is set to 7 as illustrated in FIG. 3.

As described in the description of the first embodiment, the VREF synthesizing circuit 13 compares the voltage V(BGRtemp) with the voltage VDDca and generates and outputs the voltage VREFtemp based on one of the voltages V(BGRtemp) and VDDca, which is higher than the other voltage. Accordingly, at each temperature, the voltage VREFtemp maintains a constant value independently of the power supply voltage VDD when the power supply voltage VDD is equal to or lower than the burn-in start voltage (3.8 [V]), and rises in proportion to the power supply voltage VDD when the power supply voltage is equal to or higher than the burn-in start voltage.

Figure 8:
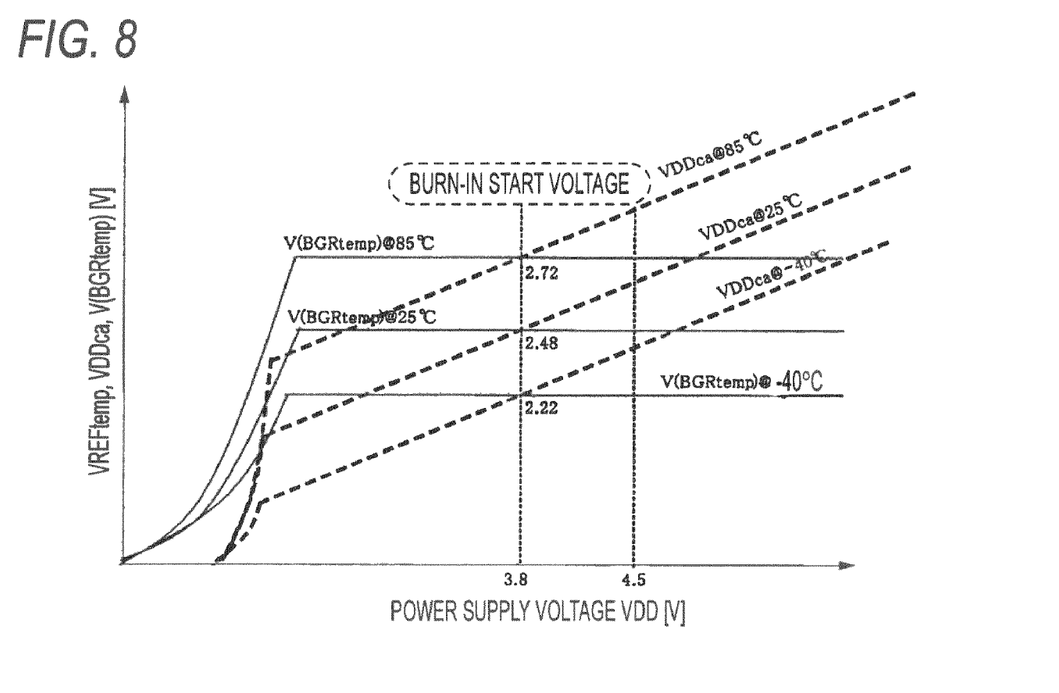
FIG. 8 is a graph illustrating an output (VREFtemp) of a VREF synthesizing circuit 13 according to the second embodiment.

FIG. 8 is a graph illustrating an output (VREFtemp) of the VREF synthesizing circuit 13 according to the second embodiment.

The ordinate axis of the graph illustrated in FIG. 8 represents the voltage VREFtemp [V]. The abscissa axis of the graph illustrated in FIG. 8 represents the power supply voltage VDD [V]. In the graph, solid lines indicate the voltages V(BGRtemp) respectively corresponding to temperatures of −40° C., 25° C., and 85° C. Dashed lines indicate the voltages VDDca respectively corresponding to temperatures of −40° C., 25° C., and 85° C.

As described above, when the power supply voltage VDD is equal to the burn-in start voltage (VDD=3.8 [V]), the temperature dependency of the reference voltage V(BGRtemp) is substantially equal to that of the voltage VDDca. Therefore, the voltage VREFtemp maintains a constant value in a case where the power supply voltage VDD<3.8 [V] and rises according to each of the dashed lines representing VDDca in a case where VDD>3.8 [V], independently of the temperature in the temperature range from −40° C. to 85° C.

That is, a burn-in (acceleration) test can be performed by using of VREFtemp that is proportional to the power supply voltage VDD from the burn-in start voltage 3.8 [V] independently of temperature.

According to the second embodiment, at the burn-in start voltage (3.8 [V]), the temperature dependency of the reference voltage V(BGRtemp) is substantially equal to that of the voltage VDDca. Consequently, a sufficient burn-in test can be performed in the temperature range from −40° C. to 85° C.

Third Embodiment

Figure 9:
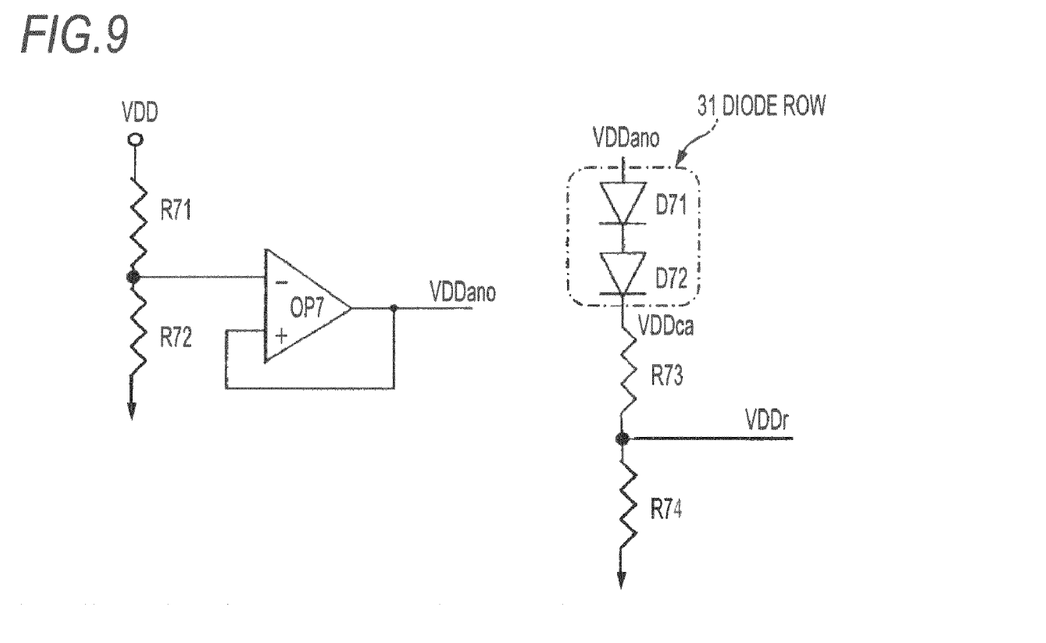
FIG. 9 is a circuit diagram illustrating a BI voltage generation circuit 12 in a reference voltage generation circuit according to a third embodiment.

FIG. 9 is a circuit diagram illustrating a BI voltage generation circuit 12 in a reference voltage generation circuit according to a third embodiment. The circuit configuration, the functions and the operation of each of a BGR circuit 11 and a VREF synthesizing circuit 13 according to the second embodiment are similar to those of the associated circuit according to the first embodiment. Thus, the detailed description of the BGR circuit 11 and the VREF synthesizing circuit 13 according to the third embodiment is omitted.

The difference between the third embodiment and the first embodiment is that a voltage VDDr obtained by dividing the voltage VDDca by resistors is input to a second input terminal of a VREF synthesizing circuit 13, instead of the voltage VDDca.

In addition, the BGR circuit 11 according to the third embodiment is set at trimming address 5. In the third embodiment, there is shown an exemplary circuit configuration capable of performing a burn-in test in the temperature range of from −40° C. to 85° C. so that the reference voltage is proportional to the power supply voltage VDD in a range where the power supply voltage VDD is equal to or higher than a burn-in start voltage of 3.8 [V] in a case where V(BGRtemp)@−40° C.=1.93 [V], V(BGRtemp)@25° C.=2.13 [V], and V(BGRtemp)@85° C.=2.32 [V].

The BI voltage generation circuit 12 according to the third embodiment includes resistors R71 and R72 used to generate a divided voltage of the power supply voltage VDD, a differential amplifier OP7, a diode row 31 in which two diodes D71 and D72 are series-connected in the same direction, and two resistors R73 and R74.

One terminal of the resistor R71 is connected to the power supply voltage VDD. The other terminal of the resistor R71 is connected to one terminal of the resistor R72. The other terminal of the resistor R72 is connected to the ground GND. The connection node between the resistors R71 and R72 is connected to a first input terminal of the differential amplifier OP7. An output of the differential amplifier OP7 is connected to a second input terminal thereof. The output of the differential amplifier OP7 is connected as VDDano to the anode terminal of the diode row 31, i.e., the anode of the diode D71. The cathode of the diode D71 is connected to the anode of the diode D72. The cathode of the diode D72, which is the cathode terminal of the diode row 31, is connected to one terminal of the resistor R73. The other terminal of the resistor R73 is connected to one terminal of the resistor R74. The other terminal of the resistor R74 is connected to the ground GND. Further, an output from the connection node between the resistors R73 and R74 is supplied as the output voltage VDDr of the BI voltage generation circuit 12 to a second input terminal of the VREF synthesizing circuit 13.

The resistors R71 and R72 are set so that $$VDDano = VDD \times \{1.93 \times (0.002 \times 125 \times 2)/(2.32-1.93) + 2 \times dio@-40°C.\}/3.8 [V] = VDD \times \{2.474 + 2 \times dio@-40°C.)/3.8 [V].$$

The voltage VDDano has a value which does not depend on temperature in the temperature range from −40° C. to 85° C. and which is proportional to the power supply voltage VDD. The diodes D71 and D72 have the same characteristic (e.g., a size (the pn-junction area), and the same temperature dependency (−0.002 [V/° C.] at a power supply voltage VDD of 3.8 [V]). The expression "dio@−40° C." represents a forward voltage drop of the diodes D71 and D72 at a temperature of −40° C.

The voltage VDDano is constant over the temperature range from −40° C. to 85° C. In addition, the temperature dependency of the forward voltage drop of each of the diodes D71 and D72 is −0.002 [V/° C.]. Thus, in a case where VDD=3.8 [V], the cathode voltage VDDca of the diode D72 has the following values at temperatures of −40° C., 25° C., and 85° C., respectively.

$$VDDca@-40°C. = 2.474 [V]$$

$$VDDca@25°C. = 2.474 + 0.002 \times 2 \times \{25-(-40)\} = 2.734 [V]$$

$$VDDca@85°C. = 2.474 + 0.002 \times 2 \times \{85-(-40)\} = 2.974 [V]$$

Moreover, the resistors R73 and R74 are set so that a ratio of the resistance value of the resistor R73 to that of the resistor R74 is 1.93:(2.474−1.93). Furthermore, the voltage VDDr at the connection node between the resistors R72 and R73 has the following values at temperatures of −40° C., 25° C., and 85° C., respectively.

$$VDDr@-40°C. = 1.93 [V]$$

$$VDDr@25°C. = 1.93 + 0.002 \times 2 \times \{25-(-40)\} \times 1.93/2.474 = 2.13 [V]$$

$$VDDr@85°C. = 1.93 + 0.002 \times 2 \times \{85-(-40)\} \times 1.93/2.474 = 2.32 [V].$$

The expression "VDDr@xx ° C." represents the voltage VDDr at each temperature "xx"° C.

The temperature dependency of the voltage VDDr where VDD=3.8 [V] are set to be substantially equal to those of the voltage V(BGRtemp) where the trimming address is set to 5 as illustrated in FIG. 3.

As described in the description of the first embodiment, the VREF synthesizing circuit 13 compares the voltage V(BGR-temp) with the voltage VDDr and generates and outputs the voltage VREFtemp based on one of the voltages V(BGR-temp) and VDDr, which is higher than the other voltage. Accordingly, at each temperature, the voltage VREFtemp maintains a constant value independently of the power supply voltage VDD when the power supply voltage VDD is equal to or lower than the burn-in start voltage (3.8 [V]), and rises in proportion to the power supply voltage VDD when the power supply voltage is equal to or higher than the burn-in start voltage.

Figure 10:
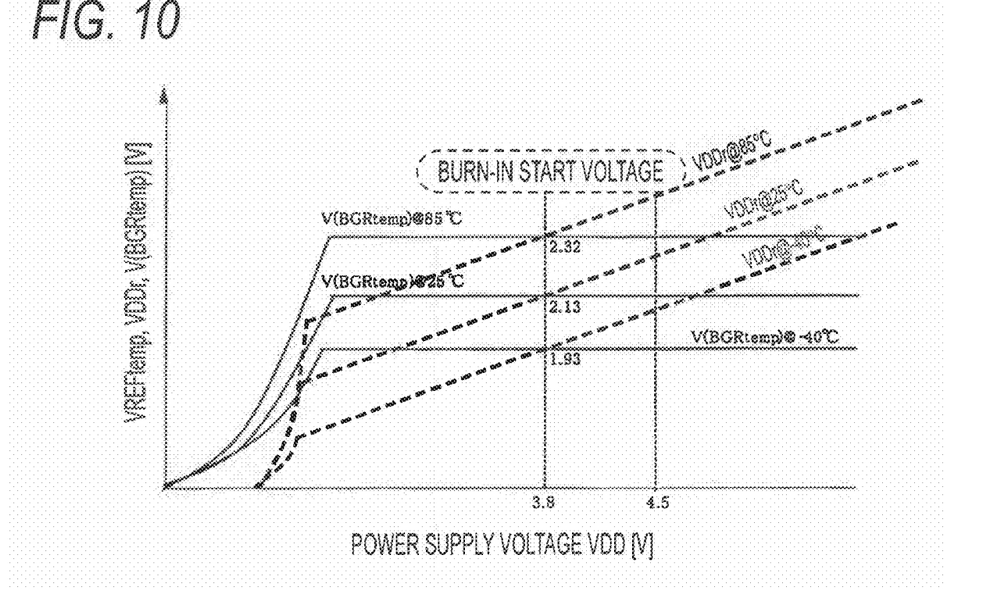
FIG. 10 is a graph illustrating an output (VREFtemp) of a VREF synthesizing circuit 13 according to the third embodiment.

FIG. 10 is a graph illustrating an output (VREFtemp) of the VREF synthesizing circuit 13 according to the third embodiment.

The ordinate axis of the graph illustrated in FIG. 10 represents the voltage VREFtemp [V]. The abscissa axis of the graph illustrated in FIG. 8 represents the power supply voltage VDD [V]. In the graph, solid lines indicate the voltages V(BGRtemp) respectively corresponding to temperatures of −40° C., 25° C., and 85° C. Dashed lines indicate the voltages VDDr respectively corresponding to temperatures of −40° C., 25° C., and 85° C.

As described above, when the power supply voltage VDD is equal to the burn-in start voltage (VDD=3.8 [V]), the temperature dependency of the reference voltage V(BGRtemp) is substantially equal to that of the voltage VDDr. Therefore, the voltage VREFtemp maintains a constant value in a case where the power supply voltage VDD<3.8 [V] and rises according to each of the dashed lines representing VDDr in a case where VDD>3.8 [V], independently of the temperature in the temperature range from −40° C. to 85° C.

That is, a burn-in (acceleration) test can be performed by using of VREFtemp that is proportional to the power supply voltage VDD from the burn-in start voltage 3.8 [V] independently of temperature.

According to the third embodiment, at the burn-in start voltage (3.8 [V]), the temperature dependency of the reference voltage V(BGRtemp) is substantially equal to that of the voltage VDDr. Consequently, a sufficient burn-in test can be performed in the temperature range from −40° C. to 85° C.

Fourth Embodiment

Figure 11:
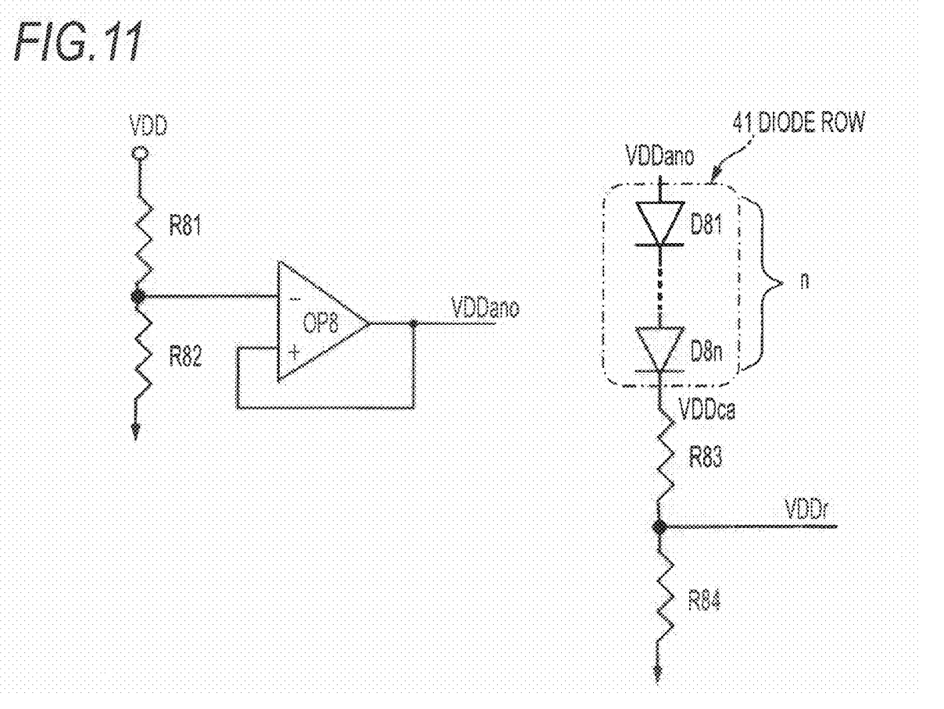
FIG. 11 is a circuit diagram illustrating a BI voltage generation circuit 12 in a reference voltage generation circuit according to a fourth embodiment.

FIG. 11 is a circuit diagram illustrating a BI voltage generation circuit 12 in a reference voltage generation circuit according to a fourth embodiment. The circuit configuration, the functions and the operation of each of a BGR circuit 11 and a VREF synthesizing circuit 13 according to the fourth embodiment are similar to those of the associated circuit according to the first embodiment. Thus, the detailed description of the BGR circuit 11 and the VREF synthesizing circuit 13 according to the fourth embodiment is omitted.

The difference between the fourth embodiment and the first embodiment is that a voltage VDDr obtained by dividing the voltage VDDca by resistors is input to a second input terminal of a VREF synthesizing circuit 13, instead of the voltage VDDca.

In the first embodiment, there is shown an exemplary circuit configuration capable of performing a burn-in test in the temperature range of from −40° C. to 85° C. so that the reference voltage is proportional to the power supply voltage VDD from a voltage (burn-in start voltage) VDD=3.8 [V] in a case where the BGR circuit 11 is set at set at arbitrary trimming address.

The BI voltage generation circuit 12 according to the fourth embodiment includes variable resistors R81 and R82 used to generate a divided voltage of the power supply voltage VDD, a differential amplifier OP8, a diode row 41 including n of diodes D81 to D8n that are series-connected in the same direction, and two resistors R83 and R84.

One terminal of the resistor R81 is connected to the power supply voltage VDD. The other terminal of the resistor R81 is connected to one terminal of the resistor R82. The other terminal of the resistor R82 is connected to the ground GND. The connection node between the resistors R81 and R82 is connected to a first input terminal of the differential amplifier OP8. An output of the differential amplifier OP8 is connected to a second input terminal thereof. The output of the differential amplifier OP8 is connected to the anode terminal of the diode row 41, i.e., the anode of the diode D81 as the voltage VDDano. The cathode of the diode D8n, which is the cathode terminal of the diode row 41, is connected to one terminal of the resistor R83. The other terminal of the resistor R83 is connected to one terminal of the resistor R84. The other terminal of the resistor R84 is connected to the ground GND. Further, an output from the connection node between the resistors R83 and R84 is supplied as the output voltage VDDr of the BI voltage generation circuit 12 to a second input terminal of the VREF synthesizing circuit 13.

In this embodiment, the diode row 41 includes n of the series-connected diodes D81 to D8n. The number n of diodes is selected based on the designated trimming address. For example, the diode row 41 may be configured so that the number of the series-connected diodes thereof is changeable in accordance with the temperature dependency of the BGR circuit 11 adjusted based on the trimming address.

In a case where the temperature dependency $X$ $(=\Delta[V(BGRtemp)]/\Delta T[mV/°C.])$ of the voltage V(BGRtemp) is selected by designating the trimming address, the number n of the series-connected diodes meets the following condition: $(n-1) \times 2 [mV/°C.] < X < n \times 2 [mV/°C.]$ (n is an integer).

The variable resistors R81 and R82 are set so that
VDDano=VDD×V(BGRtemp)@−40° C.×{0.002×(85−(−40)×n)/(V(BGRtemp)@85° C.−V(BGRtemp)@−40° C.)+n×dio@−40° C.}/3.8 [V]. The voltage VDDano has a value which does not depend on temperature in the temperature range from −40° C. to 85° C. and which is proportionate to the power supply voltage VDD.

The diodes D81 to D8n have the same characteristic (e.g., a size (the pn-junction area), and the same temperature dependency (−0.002 [V/° C.] at a power supply voltage VDD of 3.8 [V]). The expression "dio@−40° C." represents a forward voltage drop of one of the diodes D81 and D8n at a temperature of −40° C.

The ratio between the resistance values of the variable resistors R83 and R84 is set to be V(BGRtemp) @−40° C.: (V(BGRtemp) @85° C.−V(BGRtemp) @−40° C.). The voltage VDDr at the connection node between the resistors R83 and R84 is input to the second input terminal of the VREF synthesizing circuit 13 as the voltage VDDr.

As described in the description of the first embodiment, the VREF synthesizing circuit 13 compares the voltage V(BGRtemp) with the voltage VDDr and generates and outputs the voltage VREFtemp based on one of the voltages V(BGRtemp) and VDDr, which is higher than the other voltage.

Therefore, the voltage VREFtemp maintains a constant value in a case where the power supply voltage VDD<3.8 [V] and rises according to the voltage VDDr in a case where VDD>3.8 [V], independently of the temperature in the temperature range from −40° C. to 85° C.

That is, corresponding to an arbitrary trimming address, a burn-in (acceleration) test can be performed by using of VREFtemp that is proportional to the power supply voltage VDD from the burn-in start voltage 3.8 [V] independently of temperature.

According to the fourth embodiment, at the burn-in start voltage (3.8 [V]), the temperature dependency of the reference voltage V(BGRtemp) is substantially equal to that of the voltage VDDr. Consequently, a sufficient burn-in test can be performed corresponding to an arbitrary trimming address in the temperature range from −40° C. to 85° C.

In the fourth embodiment, the temperature dependency of each of the diodes D81 to D8n is −0.002 [V/° C.]. The temperature range is from −40° C. to 85° C. The burn-in start voltage is 3.8 [V]. However, the invention is not limited thereto.

That is, it is advisable to set the voltage VDDano as follows.

$$VDDano = VDD \times \{V(BGRtemp)@B[°C.] \times D \times (C-B) \times n/(V(BGRtemp)@C[°C.] - V(BGRtemp)@B[°C.]) + n \times dio@B[°C.]\}/E \, [V]$$

where D [V/° C.] is the temperature dependency of the diode, B [° C.] is the lower limit of the temperature range, C [° C.] is the upper limit thereof, and E [V] is the burn-in start voltage. In addition, it is useful to set the ratio of the resistance value of the resistor R83 to that of the resistor R84 to be V(BGRtemp)@B [° C.]:(V(BGRtemp)@C [° C.]−V(BGRtemp)@B [° C.]).

Further, in the foregoing descriptions of the first to fourth embodiments, it has been described that the reference voltage generation circuit generates VREFtemp which is a reference voltage used to read data from the memory cell. However, the reference voltage generation circuit, to which the invention is applied, is not limited thereto. For example, the invention can be applied in principle to efficiently perform a burn-in (acceleration) test by using of a reference voltage generation circuit having a temperature dependency, According to an aspect of the present invention, a sufficient burn-in test can be performed in a desired temperature range.

What is claimed is:

1. A reference voltage generation circuit comprising:
    a first circuit configured to generate a first voltage that has a substantially constant value independent of a power supply voltage when the power supply voltage is within an operational range and wherein a level of the substantially constant value is dependent on a temperature;
    a second circuit configured to generate a second voltage that is substantially proportional to the power supply voltage when the power supply voltage is within the operational range and that is dependent on the temperature; and
    a third circuit configured to compare the first voltage and the second voltage and to generate a reference voltage being substantially the same with a higher one between the first voltage and the second voltage,
    wherein the first circuit and the second circuit generate the first voltage and the second voltage to have substantially the same temperature dependencies at a given voltage.

2. The reference voltage generation circuit according to claim 1,
    wherein the power supply voltage is the given voltage.

3. The reference voltage generation circuit according to claim 1,
    wherein the second circuit includes:
        a dividing portion that outputs a divided voltage by dividing the power supply voltage;
        a diode that has:
            an anode to which the divided voltage is supplied; and
            a cathode;
        a resistor that is connected between the cathode of the diode and a ground; and an output terminal that is connected between the cathode of the diode and the resistor to output the second voltage therefrom.

4. The reference voltage generation circuit according to claim 1,
wherein the second circuit includes:
a dividing portion that outputs a divided voltage by dividing the power supply voltage;
a diode row that has:
an anode terminal to which the divided voltage is supplied; and
a cathode terminal;
a resistor that is connected between the cathode terminal of the diode row and a ground; and
an output terminal that is connected between the cathode terminal of the diode row and the resistor to output the second voltage therefrom.

5. The reference voltage generation circuit according to claim 4,
wherein the diode row includes a plurality of diodes that are series-connected in a same direction.

6. The reference voltage generation circuit according to claim 1,
wherein the second circuit includes:
a dividing portion that outputs a divided voltage by dividing the power supply voltage;
a diode row that has:
an anode terminal to which the divided voltage is supplied; and
a cathode terminal;
a first resistor that is connected to the cathode terminal of the diode row;
a second resistor that is connected between the first resistor and a ground; and
an output terminal that is connected between the first resistor and the second resistor to output the second voltage therefrom.

7. The reference voltage generation circuit according to claim 6,
wherein the diode row includes a plurality of diodes that are series-connected in a same direction.

8. The reference voltage generation circuit according to claim 7,
wherein the diode row is capable of adjusting the number of series-connected diodes.

9. The reference voltage generation circuit according to claim 8,
wherein at least one of the first resister and the second resister includes a variable resistor.

10. The reference voltage generation circuit according to claim 9,
wherein a resistance ratio between the first resister and the second resistor is adjustable.

11. The reference voltage generation circuit according to claim 10,
wherein the power supply voltage is the given voltage.

12. The reference voltage generation circuit according to claim 11,
wherein the temperature dependency of the second voltage is adjusted by adjusting the number of the series-connected diodes and the resistance ratio between the first resister and the second resistor.

13. A semiconductor storage apparatus comprising:
a plurality of memory cells;
a judgment circuit that judges a data read out of the memory cells; and
a reference voltage generation circuit according to claim 1,
wherein the judgment circuit judges the data read out of the memory cells based on the reference voltage generated by the reference voltage generation circuit.

* * * * *